(12) United States Patent
Liu et al.

(10) Patent No.: US 12,416,591 B2
(45) Date of Patent: Sep. 16, 2025

(54) TEMPERATURE-CONTROLLABLE TEST DEVICE FOR CABLE MONITORING

(71) Applicant: DONGGUAN POWER BUREAU OF GUANGDONG POWER GRID CO., LTD., Dongguan (CN)

(72) Inventors: Fang Liu, Dongguan (CN); Xiliang Dai, Dongguan (CN); Cheng Yang, Dongguan (CN); Jinning Liu, Dongguan (CN); Guanke Liu, Dongguan (CN); Jianrong Zhang, Dongguan (CN); Jinkun Shan, Dongguan (CN); Shaobing Cheng, Dongguan (CN); Min Xia, Dongguan (CN); Hanbiao Yin, Dongguan (CN); Haoer Wu, Dongguan (CN); Qingkeng Huang, Dongguan (CN); Huiyue Mao, Dongguan (CN); Guohua Chen, Dongguan (CN); Yaoyun Liu, Dongguan (CN)

(73) Assignee: DONGGUAN POWER BUREAU OF GUANGDONG POWER GRID CO., LTD., Dongguan (CN)

( * ) Notice: Subject to any disclaimer, the term of this patent is extended or adjusted under 35 U.S.C. 154(b) by 0 days.

(21) Appl. No.: 18/878,732

(22) PCT Filed: Aug. 1, 2024

(86) PCT No.: PCT/CN2024/109094
§ 371 (c)(1),
(2) Date: Dec. 24, 2024

(87) PCT Pub. No.: WO2025/050886
PCT Pub. Date: Mar. 13, 2025

(65) Prior Publication Data
US 2025/0172517 A1    May 29, 2025

(30) Foreign Application Priority Data
Sep. 4, 2023   (CN) .......................... 202311127236.7

(51) Int. Cl.
*G01N 25/00*   (2006.01)
*G01N 19/00*   (2006.01)

(52) U.S. Cl.
CPC ............ *G01N 25/00* (2013.01); *G01N 19/00* (2013.01)

(58) Field of Classification Search
None
See application file for complete search history.

(56) References Cited

FOREIGN PATENT DOCUMENTS

| CN | 108636857 A |   | 10/2018 |
| CN | 108871954 A | * | 11/2018 |

(Continued)

OTHER PUBLICATIONS

1st Chinese Office Action for Chinese Application No. 202311127236.7 dated Oct. 13, 2023, 8 pages (English translation—11 pages).

(Continued)

*Primary Examiner* — Erica S Lin
(74) *Attorney, Agent, or Firm* — CM Law; Stephen J. Weed

(57) ABSTRACT

A temperature-controllable test device for cable monitoring includes a vertical plate. The lower end of the vertical plate is secured to a base plate. A second motor is mounted on the rear side of the vertical plate. The output shaft end of the second motor extends to the front side of the vertical plate. A mounting plate is secured to the output shaft end of the second motor. A stretching mechanism is disposed inside the mounting plate and configured to stretch a cable. The stretching mechanism includes a transmission cavity formed inside the mounting plate. A first bidirectional reciprocating (Continued)

screw rod is rotatably connected between the left inner wall of the transmission cavity and the right inner wall of the transmission cavity. A turbine is mounted in the middle of the first bidirectional reciprocating screw rod.

6 Claims, 3 Drawing Sheets

(56) References Cited

FOREIGN PATENT DOCUMENTS

| | | | |
|---|---|---|---|
| CN | 111337794 | A | 6/2020 |
| CN | 111638120 | A | 9/2020 |
| CN | 112462171 | A | 3/2021 |
| CN | 212872660 | U | 4/2021 |
| CN | 213242062 | U | 5/2021 |
| CN | 113113874 | A | 7/2021 |
| CN | 216594970 | U | 5/2022 |
| CN | 114964080 | A | 8/2022 |
| CN | 218823612 | U | 4/2023 |
| CN | 218865662 | U | 4/2023 |
| CN | 218997583 | U | 5/2023 |
| CN | 116859171 | A | 10/2023 |
| KR | 102049525 | B1 | 1/2020 |

OTHER PUBLICATIONS

International Search Report for PCT/CN2024/109094 dated Nov. 6, 2024, 2 pages (English translation—3 pages).

\* cited by examiner

TEMPERATURE-CONTROLLABLE TEST DEVICE FOR CABLE MONITORING

CROSS-REFERENCE TO RELATED APPLICATIONS

This is a National Stage Application, filed under 35 U.S.C. 371, of International Patent Application No. PCT/CN2024/109094, filed on Aug. 1, 2024, which claims priority to Chinese Patent Application No. 202311127236.7 filed with the China National Intellectual Property Administration (CNIPA) on Sep. 4, 2023, the disclosures of which are incorporated herein by reference in their entireties.

TECHNICAL FIELD

The present application relates to the field of cable test devices, for example, a temperature-controllable test device for cable monitoring.

BACKGROUND

In the temperature-controllable test device for cable monitoring according to patent number CN202010334849.8, the intelligent early warning monitoring test platform for cables is a trial version of an intelligent early warning monitoring platform, the intelligent early warning monitoring test platform includes an optoelectronic composite cable, a host, and a heating test device, the heating test device heats the optoelectronic composite cable to simulate heat generation at a fault point in the cable during the testing phase, the faults include cable overload or fire, the temperature at the fault point is transmitted to the host via temperature-sensing fibers in the composite cable, and the host analyzes the temperature rise rate of the cable and over-temperature warning, thus validating the operational functionality and stability of the intelligent early warning monitoring platform.

In the related art, a heating test device typically uses a water tank or oil bath for heating. This is cumbersome to operate and is prone to damage a cable. The solution is to use a heating mold with a thermal insulation layer to heat the cable, thus simulating heat generation at a fault point. In this process, the cable is placed inside the cavity of the heating mold. An electric heating device is disposed inside the heating mold. This allows for simple and convenient heating operations that are easy to control. However, in practical use of the heating test device, the cable cannot be stretched in the heating mold, causing the cable to adhere to the inner wall of the heating mold, resulting in uneven heating of the cable.

SUMMARY

The present application provides a solution to the following problem: In practical use of the preceding heating test device, the cable cannot be stretched in the heating mold, causing the cable to adhere to the inner wall of the heating mold, resulting in uneven heating of the cable.

A temperature-controllable test device for cable monitoring includes a vertical plate. The lower end of the vertical plate is secured to a base plate. A second motor is mounted on the rear side of the vertical plate. The output shaft end of the second motor extends to the front side of the vertical plate. A mounting plate is secured to the output shaft end of the second motor.

A stretching mechanism is disposed inside the mounting plate and configured to stretch a cable. The stretching mechanism includes a transmission cavity formed inside the mounting plate. A first bidirectional reciprocating screw rod is rotatably connected between the left inner wall of the transmission cavity and the right inner wall of the transmission cavity. A turbine is mounted in the middle of the first bidirectional reciprocating screw rod. A first motor is mounted on the front side of the mounting plate. The output shaft end of the first motor extends into the transmission cavity and is secured to a linkage rod. A worm is mounted on the linkage rod and engages with the turbine. Two sliders are symmetrically threaded to the two ends of the first bidirectional reciprocating screw rod, respectively. The front side of each of the two sliders is provided with a securing assembly configured to secure the cable.

Two acutators are symmetrically mounted on the upper end of the mounting plate. Two swing arms are mounted on the two actuators one to one. The front sides of the two swing arms are collectively secured to a heating mold. A heating cavity is disposed inside the heating mold and configured to heat the cable.

In one or more embodiments, the heating mold is formed by two semicircular molds: an upper half and a lower half. A swing arm on the left side is secured to the upper half of the heating mold. A swing arm on the right side is secured to the lower half of the heating mold. An electric heating wire is embedded in the heating mold, arranged around the heating cavity, and laid along the extension direction of the heating cavity.

In one or more embodiments, the securing assembly includes two mounting blocks secured to the front side of a slider corresponding to the securing assembly. A second bidirectional reciprocating screw rod is rotatably connected between the two mounting blocks. The upper end of the second bidirectional reciprocating screw rod penetrates the upper mounting block of the two mounting blocks. A knob is secured to the upper end of the second bidirectional reciprocating screw rod. Two moving blocks are threaded to the second bidirectional reciprocating screw rod and are symmetrical about the center of the second bidirectional reciprocating screw rod. A securing plate is secured to the front side of each of the two moving blocks by a bolt.

In one or more embodiments, a cooling mechanism is disposed on the front side of the vertical plate and configured to cool the cable. The cooling mechanism includes a cooling fan mounted on the rear side of the vertical plate. A cavity is formed on the front side of the vertical plate. A hollow plate is secured to the rear inner wall of the cavity. Multiple air outlets are evenly spaced on the hollow plate.

In one or more embodiments, the air outlet end of the cooling fan extends into the interior of the hollow plate, and the cooling fan is located below the second motor.

In one or more embodiments, a heat insulating layer covers the inner wall of the heating cavity, and the heat insulating layer is made of aluminum foil.

In one or more embodiments, the heating mold is made of stainless steel, and the heating cavity is disposed along the length direction of the heating mold.

In one or more embodiments, each of the two sliders is slidably connected to the front inner wall of the transmission cavity and the rear inner wall of the transmission cavity, and the rear side of each of the two moving blocks is slidably connected to the front side of the slider to which the two moving blocks are secured.

In one or more embodiments, the first motor, the second motor, and the cooling fan are each mounted on the vertical plate by using multiple screws.

Figure 1:
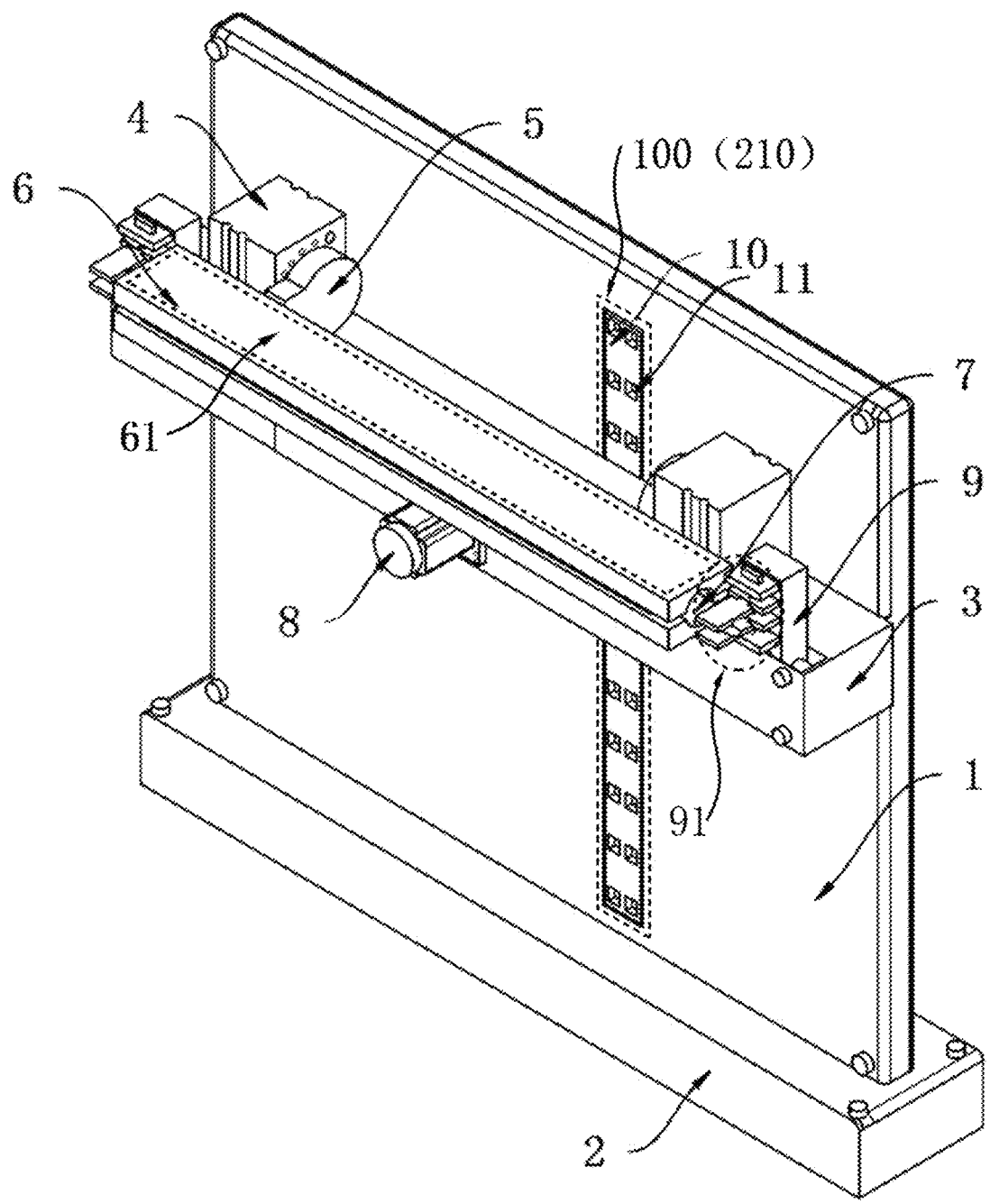
FIG. 1 is an overall structure view of a temperature-controllable test device for cable monitoring according to an embodiment of the present application.

In the drawings, 1. vertical plate; 2. base plate; 3. mounting plate; 4. actuator; 5. swing arm; 6. heating mold; 7. heating cavity; 8. first motor; 9. slider; 10. hollow plate; 11. air outlet; 12. transmission cavity; 13. first bidirectional reciprocating screw rod; 14. worm; 15. turbine; 16. linkage rod; 17. mounting block; 18. knob; 19. moving block; 20. securing plate; 21. cooling fan; 22. second motor; 23. second bidirectional reciprocating screw rod; 120. stretching mechanism; 91. securing assembly; 61. electric heating wire; 210. cooling mechanism; 100. cavity

DETAILED DESCRIPTION

Solutions of embodiments of the present application are described below with reference to drawings.

The present application provides a temperature-controllable test device for cable monitoring. As shown in FIGS. 1 to 4, the temperature-controllable test device for cable monitoring includes a vertical plate 1. The lower end of the vertical plate 1 is secured to a base plate 2. A second motor 22 is mounted on the rear side of the vertical plate 1. The output shaft end of the second motor 22 extends to the front side of the vertical plate 1. A mounting plate 3 is secured to the output shaft end of the second motor 22.

A stretching mechanism 120 is disposed inside the mounting plate 3 and configured to stretch a cable. The stretching mechanism 120 includes a transmission cavity 12 formed inside the mounting plate 3. A first bidirectional reciprocating screw rod 13 is rotatably connected between the left inner wall of the transmission cavity 12 and the right inner wall of the transmission cavity 12. A turbine 15 is mounted in the middle of the first bidirectional reciprocating screw rod 13. A first motor 8 is mounted on the front side of the mounting plate 3. The output shaft end of the first motor 8 extends into the transmission cavity 12 and is secured to a linkage rod 16. A worm 14 is mounted on the linkage rod 16 and engages with the turbine 15. Two sliders 9 are symmetrically threaded to the two ends of the first bidirectional reciprocating screw rod 13 respectively. The front side of each of the two sliders 9 is provided with a securing assembly 91 configured to secure the cable.

Two actuators 4 are symmetrically mounted on the upper end of the mounting plate 3. Two swing arms 5 are mounted on the two actuators 4 one to one. The front sides of the two swing arms 5 are collectively secured to a heating mold 6. A heating cavity 7 is disposed inside the heating mold 6 and configured to heat the cable.

As shown in FIG. 1, the heating mold 6 is formed by two semicircular molds: an upper half and a lower half. A swing arm 5 on the left side is secured to the upper half of the heating mold 6. A swing arm 5 on the right side is secured to the lower half of the heating mold 6. An electric heating wire 61 is embedded in the heating mold 6 and laid around the heating cavity 7 and also along the extension direction of the heating cavity 7. This arrangement ensures temperature uniformity in the heating cavity 7.

As shown in FIGS. 1 to 4, the securing assembly 91 includes two mounting blocks 17 secured to the front side of a slider 9 corresponding to the securing assembly 91. A second bidirectional reciprocating screw rod 23 is rotatably connected between the two mounting blocks 17. The upper end of the second bidirectional reciprocating screw rod 23 penetrates the upper mounting block 17 of the two mounting blocks 17. A knob 18 is secured to the upper end of the second bidirectional reciprocating screw rod 23. Two moving blocks 19 are symmetrically threaded to two ends of the second bidirectional reciprocating screw rod 23, respectively. For each of the two moving blocks 19, a securing plate 20 is secured to the front side of the moving block 19 by a bolt. Each of the two sliders 9 is slidably connected to the front inner wall of the transmission cavity 12 and the rear inner wall of the transmission cavity 12, and the rear side of each of the two moving blocks 19 is slidably connected to the front side of the slider 9 to which the two moving blocks 19 are secured.

Figure 2:
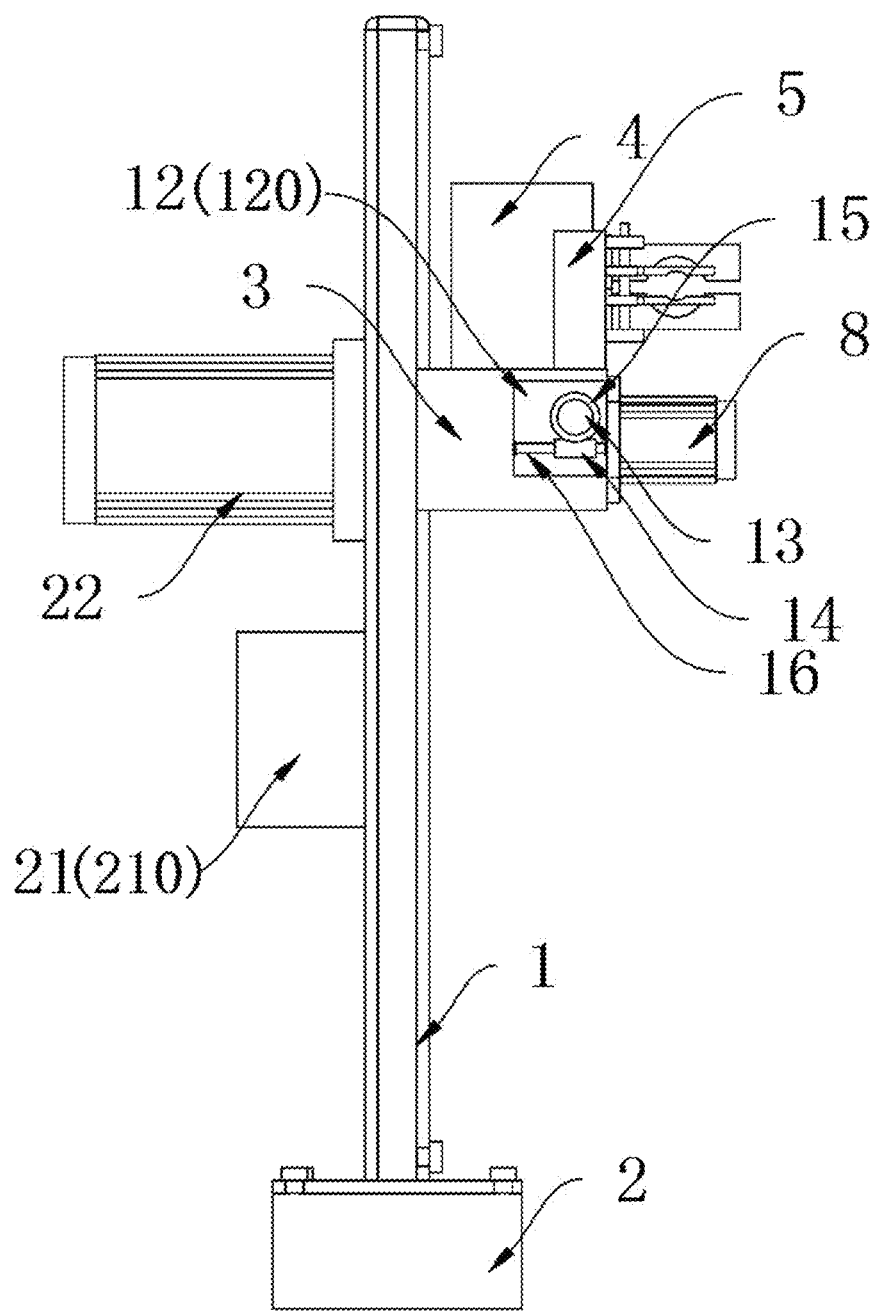
FIG. 2 is a left-side section view of a temperature-controllable test device for cable monitoring according to an embodiment of the present application.
Figure 3:
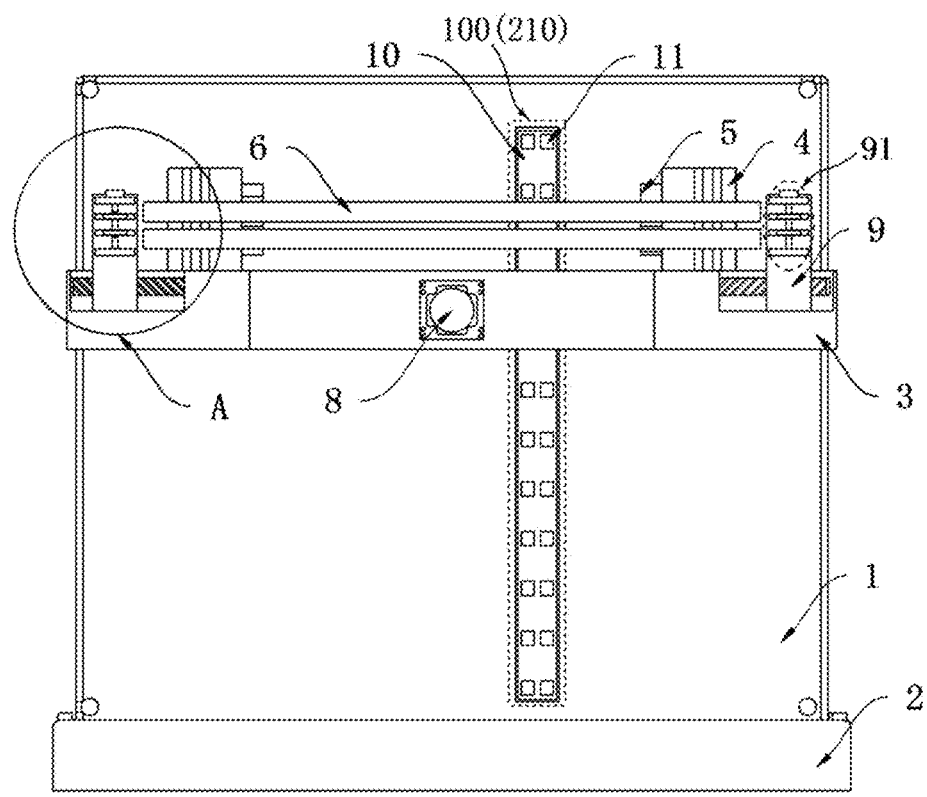
FIG. 3 is an overall section view of a temperature-controllable test device for cable monitoring according to an embodiment of the present application.
Figure 4:
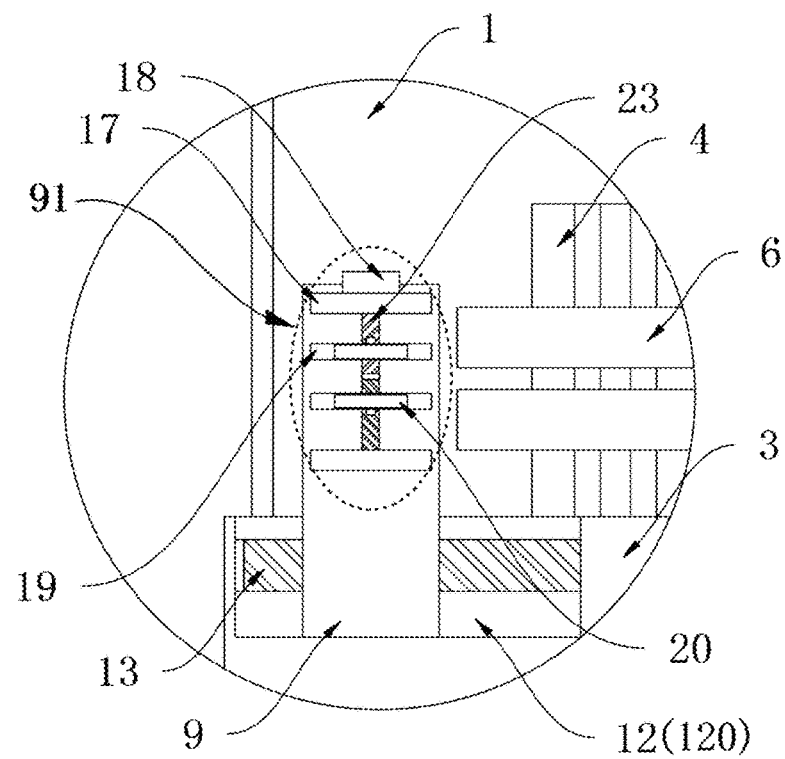
FIG. 4 is an enlarged view of A of FIG. 3 according to an embodiment of the present application.

As shown in FIGS. 1 and 2, a cooling mechanism 210 is disposed on the front side of the vertical plate 1 and configured to cool the cable. The cooling mechanism 210 includes a cooling fan 21 mounted on the rear side of the vertical plate 1. A cavity 100 is formed on the front side of the vertical plate 1. A hollow plate 10 is secured to the rear inner wall of the cavity 100. Multiple air outlets 11 are evenly spaced on the hollow plate 10. The air outlet end of the cooling fan 21 extends into the interior of the hollow plate 10. The cooling fan 21 is located below the second motor 22.

As shown in FIG. 1 a heat insulating layer covers the inner wall of the heating cavity 7, and the heat insulating layer is made of aluminum foil. The heating mold 6 is made of stainless steel. The heating cavity 7 is disposed along the length direction of the heating mold 6. The first motor 8, the second motor 22, and the cooling fan 21 are each mounted on the vertical plate 1 by using multiple screws.

The following describes the working principle of the present application:

During use, first, the heating mold 6 is opened using the two actuators 4. Then, the cable is placed inside the heating cavity 7, with both ends of the cable positioned between the two securing plates 20. Next, the corresponding knob 18 is turned, causing the two moving blocks 19 to move relative to each other, causing the securing plates 20 to quickly secure both ends of the cable. Finally, the two actuators 4 are used to completely close the heating mold 6.

Different securing components can be mounted on the securing plates 20 by using bolts, enhancing the securing effect for various cables and allowing for adaptability in securing operations for different types of cables.

The first motor 8 is started to drive the linkage rod 16 to rotate, causing the worm 14 to rotate. Since the worm 14 engages with the turbine 15, the turbine 15 drives the first bidirectional reciprocating screw rod 13 to rotate. This causes the two sliders 9 to move away from each other, thus stretching the cable and preventing the cable from adhering to the inner wall of the heating mold 6. This process improves the heating efficiency of the cable.

Subsequently, an external power source is connected to the joint, thus providing power to the electric heating wire 61 in the heating mold 6. This causes the temperature in the heating cavity 7 to rise, and heat is transferred to the cable to heat the cable.

When the experiment is completed, the second motor 22 is activated to rotate the entire mounting plate 3. After a 90° rotation, the heating mold 6 faces the hollow plate 10. Then, the two actuators 4 are used to fully open the heating mold 6, exposing the cable to the external environment for cooling. Due to the clamping action of the multiple securing plates 20, the cable does not fall. Subsequently, the cooling fan 21 is started. Once started, the cooling fan 21 blows cold air through the multiple air outlets 11 towards the cable, allowing the cable to cool quickly without the need for a prolonged cooling process. This also facilitates better recovery of the cable by the staff.

The preceding embodiments are intended to illustrate solutions of the present application and not to limit solutions of the present application.

What is claimed is:

1. A temperature-controllable test device for cable monitoring, comprising a vertical plate, wherein a lower end of the vertical plate is secured to a base plate, a second motor is mounted on a rear side of the vertical plate, an output shaft end of the second motor extends to a front side of the vertical plate, and a mounting plate is secured to the output shaft end of the second motor; and the second motor is initiated to rotate the mounting plate by 90°;

wherein a stretching mechanism is disposed inside the mounting plate and configured to stretch a cable, the stretching mechanism comprises a transmission cavity formed inside the mounting plate, a first bidirectional reciprocating screw rod is rotatably connected between a left inner wall of the transmission cavity and a right inner wall of the transmission cavity, a turbine is mounted in a middle of the first bidirectional reciprocating screw rod, a first motor is mounted on a front side of the mounting plate, an output shaft end of the first motor extends into the transmission cavity and is secured to a linkage rod, a worm is mounted on the linkage rod and engages with the turbine, two sliders are symmetrically threaded to the first bidirectional reciprocating screw rod, and a front side of each of the two sliders is provided with a securing assembly configured to secure the cable;

two actuators are symmetrically mounted on an upper end of the mounting plate, each of two swing arms is mounted on a respective one of the two actuators, front sides of the two swing arms are collectively secured to a heating mold, a heating cavity is disposed inside the heating mold and configured to heat the cable;

the securing assembly comprises two mounting blocks secured to a front side of a slider corresponding to the securing assembly, a second bidirectional reciprocating screw rod is rotatably connected between the two mounting blocks, an upper end of the second bidirectional reciprocating screw rod penetrates an upper mounting block of the two mounting blocks, a knob is secured to the upper end of the second bidirectional reciprocating screw rod, two moving blocks are symmetrically threaded to the second bidirectional reciprocating screw rod, and a securing plate is secured to a front side of each of the two moving blocks by a bolt;

each of the two sliders is slidably connected to a front inner wall of the transmission cavity and a rear inner wall of the transmission cavity, and a rear side of each of the two moving blocks is slidably connected to a front side of a slider to which the two moving blocks are secured; and a cooling mechanism is disposed on the front side of the vertical plate and configured to cool the cable, the cooling mechanism comprises a cooling fan mounted on the rear side of the vertical plate, a cavity is formed on the front side of the vertical plate, a hollow plate is secured to a rear inner wall of the cavity, and a plurality of air outlets are evenly spaced on the hollow plate.

2. The temperature-controllable test device for cable monitoring of claim 1, wherein the heating mold is formed by two semicircular molds: an upper half and a lower half, a left swing arm of the two swing arms is secured to the upper half of the heating mold, a right swing arm of the two swing arms is secured to the lower half of the heating mold, and an electric heating wire is embedded in the heating mold and is laid around the heating cavity and along an extension direction of the heating cavity.

3. The temperature-controllable test device for cable monitoring of claim 1, wherein an air outlet end of the cooling fan extends into an interior of the hollow plate, and the cooling fan is located below the second motor.

4. The temperature-controllable test device for cable monitoring of claim 1, wherein a heat insulating layer covers an inner wall of the heating cavity, and the heat insulating layer is made of aluminum foil.

5. The temperature-controllable test device for cable monitoring of claim 1, wherein the heating mold is made of stainless steel, and the heating cavity is disposed along a length direction of the heating mold.

6. The temperature-controllable test device for cable monitoring of claim 1, wherein the first motor, the second motor, and the cooling fan are each mounted on the vertical plate by using multiple screws.

* * * * *